US005108869A

United States Patent [19]

Stone

[11] Patent Number: 5,108,869

[45] Date of Patent: Apr. 28, 1992

[54] DIAZO REPROGRAPHIC PAPER WITH SUBSTANTIALLY TRANSPARENT, FLEXIBLE POLYMERIC SHEET PROTECTIVE LAYER

[76] Inventor: Jeffrey A. Stone, 14300 Soula Dr., Albuquerque, N. Mex. 87123

[21] Appl. No.: 642,796

[22] Filed: Jan. 18, 1991

[51] Int. Cl.[5] .......................... G03F 7/016; G03C 1/52; G03C 5/18

[52] U.S. Cl. .......................... 430/162; 430/150; 430/368; 430/930

[58] Field of Search .............. 430/162, 368, 540, 150, 430/930

[56] References Cited

U.S. PATENT DOCUMENTS

| | | | |
|---|---|---|---|
| 1,721,244 | 7/1929 | Berthon | 430/162 |
| 1,762,935 | 6/1930 | Sheppard et al. . | |
| 2,214,205 | 9/1940 | Potter et al. . | |
| 2,495,661 | 1/1950 | Scanlan | 430/368 |
| 2,993,803 | 7/1961 | Sulich, Jr. et al. | 430/162 |
| 3,266,973 | 8/1966 | Crowley | 430/368 |
| 3,284,201 | 11/1966 | Meijs et al. | 430/150 |
| 4,296,198 | 10/1981 | Trautweiler | 430/403 |
| 4,543,316 | 9/1985 | Thoese | 430/162 |

*Primary Examiner*—Richard L. Schilling
*Assistant Examiner*—Christopher G. Young
*Attorney, Agent, or Firm*—Dennison, Meserole, Pollack & Scheiner

[57] ABSTRACT

A light sensitive reprographic paper which is protected against deterioration caused by rough handling. The paper comprises a paper base having first and second surfaces, and a coating on the first surface comprising a light sensitive diazo-containing composition which develops by reaction with ammonia gas. The paper is adapted for development by exposure of one of the first and second surfaces to ammonia gas. A substantially transparent, flexible, polymeric sheet is permanently laminated to the paper surface which is not to be exposed to the gas.

10 Claims, 1 Drawing Sheet

DIAZO REPROGRAPHIC PAPER WITH SUBSTANTIALLY TRANSPARENT, FLEXIBLE POLYMERIC SHEET PROTECTIVE LAYER

BACKGROUND OF THE INVENTION

1. Field of the Invention

This invention relates to the field of reprographic papers used for copying architectural plans, engineering drawings and charts.

2. Description of Related Art

Reprographic papers, in particular blueprint and brownprint or sepia papers, have been used for many years by architects and engineers to make to copies of plans, drawings and charts. These papers, which are not based on silver halides, utilize a relatively simple technology which can be used in the field and does not required a darkroom.

The original blueprint papers were based on ferric salts and ferricyanides. Iron based papers, however, are relatively insensitive to light and require aqueous development.

The original sepia processes utilized iron salts together with another metal salt, in particular silver salts. Although silver salts are light sensitive, they were not used in sepia papers for their light sensitivity, but only as image formers.

In order to overcome the disadvantages of iron-based papers, diazo papers were developed in the 1920's and are still used today. Diazo papers are based upon the photosensitivity of diazo compounds RN=NX, where R is a hydrocarbon radical and X is any electronegative substituent. The diazo component is combined in the paper with a coupling component, and when the exposed paper is developed by exposure to ammonia gas, the diazo and coupling components form a colored diazo dye.

The first rapid developing diazo papers were disclosed in 1927 in U.S. Pat. No. 1,628,279, which utilized p-dimethyl- and p-diethyl-aminobenzenediazonium chloride sensitizers. This general technology is still used today in the use of 2,5-dialkoxy-4-morpholinobenzenediazonium compounds as sensitizers. After exposure to light, the paper is developed by exposure to the vapor of aqueous ammonia.

After development, these reprographic papers are frequently subjected to frequent and rough handling, and exposure to harsh outdoor environments, including bright sunlight. In the past, users of the papers would attempt to impart some degree of protection by taping the edges with one-inch wide masking tape, so that one half inch of tape would overlap the edge on both the front and back of the blueprint. This is of course a time consuming process, and makes the drawings difficult to handle; in time, the tape will yellow and become brittle.

SUMMARY OF THE INVENTION

It is therefore the object of the invention to provide a reprographic paper which is protected against deterioration due to rough handling, exposure to fluorescent light prior to development, and exposure to bright sunlight after development.

It is another object of the invention to provide a reprographic paper with color-fastness, even when subjected to outdoor environments.

It is a further object of the invention to provide a protected reprographic paper which is supplied in stock form prior to use.

To achieve these and other objects, the present invention provides a light sensitive reprographic paper comprising a paper base having first and second surfaces and a coating on the first surface comprising a light sensitive diazo-containing composition which develops by reaction with ammonia gas. The reprographic paper is adapted for development by exposure of one of the first and second surfaces to ammonia gas. On the other of the first and second surfaces, there is a substantially transparent flexible polymeric sheet permanently laminated thereto. The polymeric sheet allows for exposure and development in the normal manner but protects the final prints against rough handling and premature deterioration. In addition, the polymeric sheet can extend the shelf life of the paper prior to exposure and development.

Reprographic papers are adapted for development by exposure of one of the two surfaces thereof to ammonia gas. Therefore, the polymeric protective sheet is laminated to the surface of the paper which is not intended for exposure to the gas. In the case of blueprint paper, it is the back side of the paper, not coated with emulsion, which is typically exposed to the gas and therefore the polymeric sheet will be applied over the emulsion. In the case of sepia paper, it is the emulsion surface which is generally exposed to the gas and therefore the polymeric sheet will be laminated to the back side of the paper, allowing changes to be made to the emulsion after development by correcting fluid or by erasing.

The polymeric sheet is applied to the paper by use of an adhesive, typically supplied coated to one side of the sheet. For this reason, a clear tape is the preferred protective material, and in particular, clear cellophane tape, sold commercially as "mailing tape," can be used. The use of a conventional clear cellophane tape greatly simplifies the process of manufacturing the protected reprographic paper, since both the paper and tape are typically produced in 10–20 foot wide rolls. The full width tape can be laminated to the full width paper, followed by longitudinal slitting to the desired width and lateral slitting to the final paper size. This can be done with existing manufacturing equipment, and should add minimal cost to the reprographic paper manufacturing process.

While cellophane tape is preferred due to its low cost and availability, other flexible, substantially transparent polymeric sheets may be used for lamination as long as they remain relatively transparent and permanent over the expected life of the blueprint. Sheets which have the ability to accept writing thereon are useful.

The transparent tape used as the protective layer according to the invention will generally conform to the average properties of Federal Standard 147:

Total Thickness: 0.002–0.0035" (0.0508–0.0889 mm):
Adhesion to Steel: 30–50 oz./in.width
Stretch at Break: 60–110%
Water Vapor Transmission: less than 1 g. $H_2O$/100 $in^2$/24 hr.
Longitudinal Tensile Strength: 30–45 lb./in. width
Transverse Tensile Strength: 40–65 lb/in. width.

The adhesive used should be substantially transparent, and provide good water, abrasion, and chemical resistance, as well as good thermal properties, adhering over a wide range of temperatures. No particular adhesive composition is thought to be critical.

The lamination is to be considered permanent since the protective sheet will not dissolve or disintegrate during development, and since it cannot be removed without damaging the paper.

DESCRIPTION OF THE PREFERRED EMBODIMENTS

Figure 1:
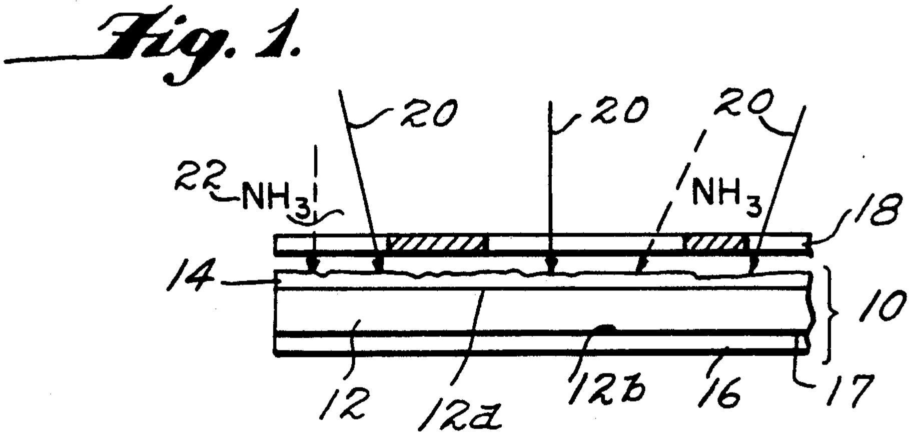
FIG. 1 is a longitudinal cross-section of a reprographic sepia paper according to the invention, showing exposure and development thereof.

FIG. 1 shows a reprographic sepia or brownprint paper according to the invention. The base paper 12 is relatively thin and is coated on one surface 12*a* with a diazo containing layer 14 which is light sensitive. The opposite surface of the paper 12*b* is covered by a flexible cellophane sheet 16 adhered by a substantially transparent adhesive layer 17.

Sepia paper is used in the architectural and engineering industries as an inexpensive way to make a reproducible copy from an original drawing done on mylar. In this case, the paper 10 is exposed to a mylar drawing 18 by light rays 20. After exposure, the emulsion surface of the paper 10 is exposed to ammonia gas, designated 22, for development of the paper. Because it is the emulsion surface which is actually exposed to the ammonia gas, the protective layer 16 is applied to the back surface of the sepia paper.

Figure 2:
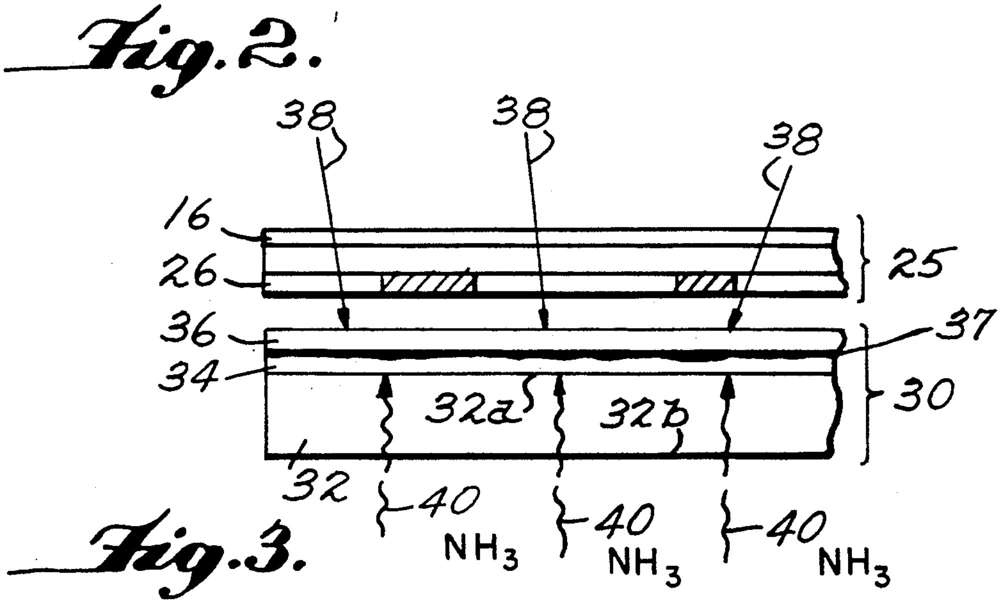
FIG. 2 is a longitudinal cross-section of a reprographic blueprint paper according to the invention, showing exposure and development thereof.

A blueprint paper 30 according to the invention is shown in FIG. 2. The paper base of the blueprint paper 32 is typically much heavier than the paper base 12 of the sepia paper. Because the sepia paper is relatively transparent as compared with blueprint paper, the sepia paper can be used in place of an original for exposing the blueprint paper. Thus, in FIG. 2, the "original" print to be reproduced is actually a developed sepia paper 25, having a developed emulsion 26 on one surface and a protective polymeric sheet 16 on the opposite surface.

The base paper 32 of blueprint paper 30 has a first surface 32*a* coated with an emulsion layer 34. With blueprint papers, both surfaces are exposed to the aqueous ammonia gas, and penetration takes place through the non-emulsion surface since it is more permeable. For that reason, surface 32*b* of paper 32 is not covered and a protective polymeric sheet 36 is applied over the emulsion layer with an interposed transparent adhesive layer 37. Light rays 38 pass through the sepia paper and through the protective layer 36 and strike emulsion layer 34 of the blueprint paper. Subsequently, the blueprint paper is developed by exposure to ammonia gas, designated 40, which passes through the relatively porous paper 32 to develop the emulsion.

Figure 3:
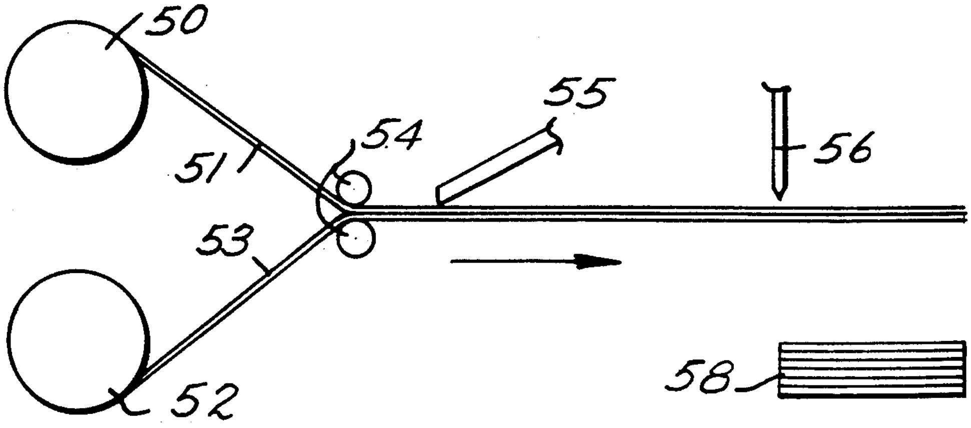
FIG. 3 is a schematic diagram showing the manufacture of a reprographic paper according to the invention.

FIG. 3 shows schematically a simple manufacturing process for a blueprint paper according to the invention. In the process, a roll 50 of cellophane tape having an adhesive surface 51 and a roll of blueprint paper 52 having an emulsion surface 53 are unrolled together; both rolls are the same width The adhesive surface of the tape is laminated to the emulsion surface of the blueprint paper by rollers 54 and the paper is slit longitudinally by knife 55. Knife 56 slits the narrower width paper laterally to produce a stack of sheets 58 of the desired size.

What is claimed is:

1. A light sensitive reprographic paper, comprising:
   a paper base having first and second surfaces;
   a coating on said first surface comprising a light sensitive diazo-containing composition which develops by reaction with ammonia gas;
   wherein said reprographic paper is adapted for development by exposure of one of said first and second surfaces to ammonia gas; and
   a substantially transparent, flexible polymeric sheet having a water vapor transmission of less than about 1 g $H_2O$/100 $in^2$/24 hr, permanently laminated to the other of said first and second surfaces, thereby permitting development of said diazo-containing composition upon exposure of said reprographic paper to ammonia gas.

2. A paper according to claim 1, wherein said polymeric sheet is coated on one surface thereof with an adhesive which bonds said sheet to said paper base.

3. A paper according to claim 2, wherein said polymeric sheet comprises cellophane tape.

4. A paper according to claim 3, wherein said tape has a thickness of about 0.05–0.1 mm.

5. A paper according to claim 2, wherein said adhesive is substantially transparent.

6. A paper according to claim 1, wherein said polymeric sheet is laminated over said coating.

7. A paper according to claim 1, wherein said polymeric sheet is laminated to the surface of said paper base which is not coated with said composition.

8. A paper according to claim 6, wherein said diazo-containing composition develops a blue image after exposure to light and reaction to ammonia gas.

9. A reprographic paper according to claim 7, wherein said paper base is relatively translucent, and said diazo-containing composition develops a brown image after exposure to light and reaction with ammonia gas.

10. A process for protecting reprographic paper having first and second surfaces, said first surface carrying a coating of a light-sensitive diazo-containing composition which develops by exposure to ammonia gas, said process comprising the steps of:
    permanently laminating to one of said first and second surfaces a substantially transparent, flexible polymeric sheet having a water vapor transmission of less than about 1 g $H_2O$/100 $in^2$/24 hr;
    exposing said first surface to light radiation in the form of an image to be reproduced; and
    exposing to ammonia gas one of said first and second surfaces which is not laminated to said sheet, causing development of said coating and formation of a reproduced image on said coating.

* * * * *